(12) United States Patent
Kulp

(10) Patent No.: US 7,629,184 B2
(45) Date of Patent: Dec. 8, 2009

(54) RFID TEMPERATURE SENSING WAFER, SYSTEM AND METHOD

(75) Inventor: John M. Kulp, Canyon Lake, TX (US)

(73) Assignee: Tokyo Electron Limited, Tokyo (JP)

( * ) Notice: Subject to any disclaimer, the term of this patent is extended or adjusted under 35 U.S.C. 154(b) by 360 days.

(21) Appl. No.: 11/688,421

(22) Filed: Mar. 20, 2007

(65) Prior Publication Data

US 2008/0230866 A1 Sep. 25, 2008

(51) Int. Cl.
*H01L 21/00* (2006.01)

(52) U.S. Cl. .............................. 438/14; 438/15; 438/17; 438/530; 257/E21.051; 257/E21.053; 257/E21.091; 257/E21.324; 257/E21.632

(58) Field of Classification Search ............. 438/14–17, 438/530, 584, 763; 257/E21.051, 53, 91, 257/324, 632
See application file for complete search history.

(56) References Cited

U.S. PATENT DOCUMENTS

| | | | | | |
|---|---|---|---|---|---|
| 3,742,174 | A | * | 6/1973 | Harnden, Jr. ................. | 219/627 |
| 3,742,178 | A | * | 6/1973 | Harnden, Jr. ................. | 219/627 |
| 3,742,179 | A | * | 6/1973 | Harnden, Jr. ................. | 219/627 |
| 4,716,411 | A | * | 12/1987 | Nakamura ............. | 340/870.17 |
| 5,969,639 | A | * | 10/1999 | Lauf et al. ............. | 340/870.17 |
| 6,568,848 | B1 | * | 5/2003 | Chapman et al. ............. | 374/155 |
| 6,617,963 | B1 | * | 9/2003 | Watters et al. ........... | 340/10.41 |
| 6,675,119 | B1 | * | 1/2004 | Liu ............................. | 702/121 |
| 6,744,346 | B1 | * | 6/2004 | Akram et al. ................. | 338/25 |
| 6,847,912 | B2 | | 1/2005 | Forster | |
| 6,889,568 | B2 | * | 5/2005 | Renken ...................... | 73/866.1 |
| 6,907,364 | B2 | * | 6/2005 | Poolla et al. ................... | 702/65 |
| 7,089,099 | B2 | * | 8/2006 | Shostak et al. ................ | 701/32 |
| 7,135,852 | B2 | * | 11/2006 | Renken et al. ........... | 324/158.1 |
| 7,148,803 | B2 | * | 12/2006 | Bandy et al. ........... | 340/539.16 |
| 7,151,366 | B2 | * | 12/2006 | Renken et al. ........... | 324/158.1 |
| 7,233,874 | B2 | * | 6/2007 | Ye et al. ...................... | 702/117 |
| 7,245,136 | B2 | * | 7/2007 | Hembree .................... | 324/755 |
| 7,259,110 | B2 | * | 8/2007 | Ohnuma et al. ............. | 438/782 |
| 7,403,834 | B2 | * | 7/2008 | Poolla et al. ................. | 700/121 |
| 7,419,299 | B2 | * | 9/2008 | Akram et al. ................ | 374/137 |
| 7,452,793 | B2 | * | 11/2008 | Kaushal et al. ............. | 438/530 |
| 7,456,977 | B2 | * | 11/2008 | Ramsey et al. ............. | 356/620 |
| 7,460,972 | B2 | * | 12/2008 | Somayaji et al. ............ | 702/130 |
| 7,540,188 | B2 | * | 6/2009 | Wiese et al. .................. | 73/431 |

* cited by examiner

*Primary Examiner*—Michael S Lebentritt
(74) *Attorney, Agent, or Firm*—Wood, Herron & Evans, L.L.P.

(57) ABSTRACT

A method of manufacturing semiconductor wafers is provided that comprises processing a semiconductor wafer to form at least one temperature-sensing RF device on the wafer and further processing the wafer to form a plurality of semiconductor products on the wafer while sensing temperature on the wafer with the formed RF device and wirelessly transmitting data from the RF device. Semiconductor wafers made according to the method are provided having at least one active RFID temperature-sensing device and semiconductor device products formed thereon. The RFID devices are located on portions of the wafer that are disposable when the semiconductor device products are cut from the wafers. A semiconductor wafer processing apparatus is provided having an RF antenna and transmitter and receiver circuits that communicate with RF devices on a wafer during processing.

23 Claims, 4 Drawing Sheets

RFID TEMPERATURE SENSING WAFER, SYSTEM AND METHOD

This application relates to the monitoring and control of wafer temperature in semiconductor manufacturing processes.

BACKGROUND OF THE INVENTION

The manufacture of semiconductors involves subjecting a substrate, for example a silicon wafer, to a series of processes. Depending on the nature and purpose of the device, a large number of processes can be involved, including heat treating, deposition, etching, patterning, and other processes. Each of these processes can include a number of process steps. Twenty or thirty or more mask layers and a hundred or more process steps can be involved. Most of these steps are temperature sensitive, requiring precise temperature control and temperature uniformity across the surface of the wafer.

Temperature control in semiconductor wafer processing can be carried out by preprogramming process parameters, or by using closed or open loop temperature control systems. Typically, some form of temperature sensors are used to monitor process chamber temperature or substrate support temperature. Often an in-chamber temperature probe is used to sense the temperature of the gas in the chamber or that of a plasma when one is present. Alternatively, a pyrometer or other radiation type sensor or optical sensor is used to measure gas temperature or the temperature of the wafer being processed. Temperature sensors are often included in the substrate support or the substrate heating plate to monitor and control the support temperature or to approximate the temperature of a supported wafer. None of these methods is perfect in determining the actual temperature of a wafer during processing, and particularly in determining temperature variations or uniformity across the wafer surface during processing.

To predict wafer temperature during processing, often calibration wafers are used that are run through actual processes. These calibration wafers have probes which have been fixed to test wafers to monitor temperatures and temperature variations and profiles throughout the course of a process or series of process steps. For example, U.S. Pat. Nos. 6,889,568, 7,135,852 and 7,151,366 disclose the use of temperature sensors placed on or in a calibration or test wafer. With such systems, simulated temperature conditions can be monitored by the calibration or test wafer and temperature tables can be stored in memory and correlated with the process parameters that were used to generate them. As such, wafer temperature can be estimated indirectly, by measuring those other parameters and consulting the tables. For accuracy, these systems depend on the conditions of the actual process corresponding exactly to the conditions that existed when the test wafer was measured.

Lack of accuracy in the monitoring or control of the actual temperatures of wafers during processing, as well as the temperature uniformity across the wafers, can result in loss of quality in the wafers being processed and the semiconductor circuits and devices being manufactured.

Accordingly, there remains a need to more accurately determine and control the temperatures on the surfaces of semiconductor wafers during processing.

The embodiments, objectives and advantages of the invention will be more readily apparent from the following detailed description, in which:

DETAILED DESCRIPTION OF THE ILLUSTRATED EMBODIMENTS

Figure 1:
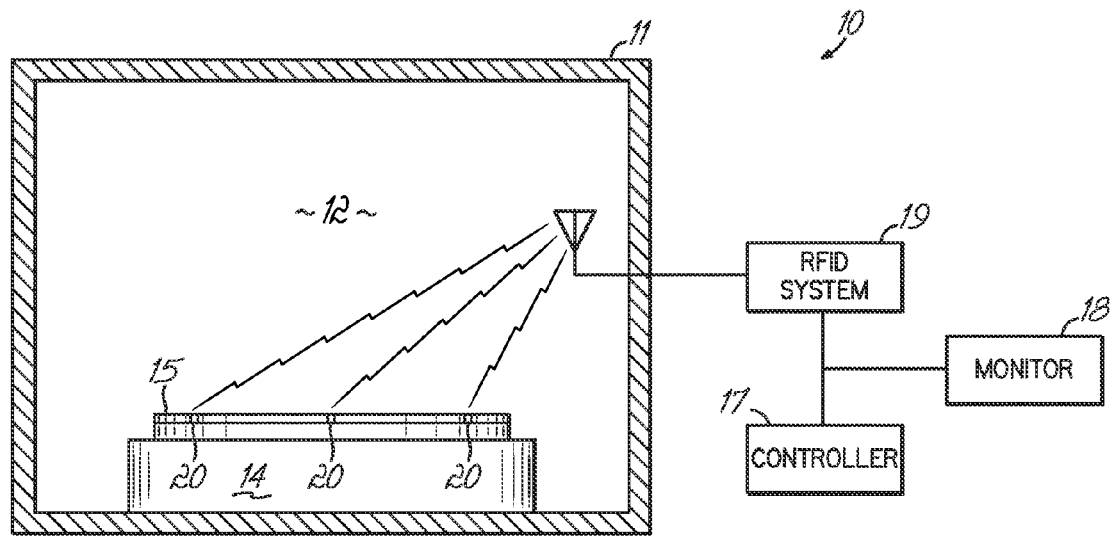
FIG. 1 is a diagram of a semiconductor wafer processing apparatus shown processing an RFID temperature sensing semiconductor wafer according to an embodiment of the invention.

The advantages of the present invention include providing for the monitoring of temperature or other properties on semiconductor wafers during processing and for the measuring of the actual temperature at one or more locations on the product wafers being processed. For example, temperature is monitored on semiconductor wafers during processing by RF sensor devices on semiconductor wafers that communicate with semiconductor-wafer, process-monitoring or process-control systems in the course of semiconductor manufacture. Semiconductor wafers may be provided having temperature sensing communication devices formed to communicate wafer temperature information when the wafers are placed in a wafer processing apparatus and exposed to a wafer manufacturing process. Temperature sensing RF communication devices can be formed on semiconductor wafers to communicate the wafer temperature information to a temperature monitoring or a process control system of a wafer processing apparatus.

In some embodiments of the invention, a wafer may be an otherwise blank product wafer having one or more RF temperature sensing devices formed thereon prior to being supplied to a semiconductor manufacturer. In other embodiments, the wafer may be an initially blank wafer on which one or more sensing devices can be formed in the course of the semiconductor product manufacturing processes on the wafer. The formed devices can be rendered active as further processes are being carried out on the wafer for use in communicating wafer temperature or other information to monitoring systems or control systems associated with the semiconductor manufacturing equipment in which the wafer is being processed. Such devices may, for example, be formed on a silicon wafer by processing the wafer, and may include transistors and other components formed by the initial layers applied to the wafer by processing.

The devices on a wafer may be wireless communication devices that include a sensor that senses some condition on the wafer, along with logic circuitry and the capacity to derive power from an interrogating signal or the environment. The devices on the wafer may use RFID communication technology and include temperature sensors and logic to deliver temperature measurement data to an RF communication portion of the device for transmission to an RF communication system associated with the processing apparatus. Semiconductor wafers can have one or more RFID devices or a plurality of RFID devices distributed over the surface of a wafer. Each of the devices may be configured to sense and transmit information of the temperature at a location on the wafer, and may further transmit information identifying the sensor so as to associate the temperature information with a specific location on the wafer.

The RF temperature sensing devices should be formed on the wafer in a manner that will give them the capability to resist damage from the processes that will be performed on the wafer and which they will monitor. By making the devices of the same layers and materials, and of the same underlying transistors and other components of which the other product devices will be made on the wafer, the RF temperature sensing devices should withstand the processes to which they will be subjected. In some cases, process conditions can modulate the performance of the RF temperature sensing devices, in which cases correcting algorithms can be employed by the temperature monitoring and control system of the apparatus in which they are used.

When provided on a product wafer on which semiconductor devices or circuits are to be or are being manufactured, the RF temperature sensing devices may be located in scribe lines or at other unused portions of the wafer, and may be positioned in an array at a plurality of locations on the wafer, for example at twenty or thirty locations across a 300 millimeter wafer. Alternatively, the RF temperature sensor may be itself a product device that is cut from the wafer along with the other product devices. The RF temperature sensing devices so located are activated to transmit temperature information during semiconductor manufacturing processes performed in the manufacture of the other product devices on the wafer.

Further, a semiconductor wafer processing apparatus may have an RFID monitoring system configured to communicate with RF temperature sensing devices on wafers being processed therein. The system may be linked to a memory that records the temperature of a wafer during processing, or records temperatures at various locations across the wafer during processing, or may communicate temperature information to an operator. Alternatively or in addition, the system may be coupled to a control system of the apparatus that controls the temperature of the wafer during processing or controls some other process parameter in response to the sensed temperature. The control system can, for example, control the temperature distribution across a wafer during processing by controlling a multi-zone wafer supporting chuck that is capable of heating or cooling areas of the wafer selectively or according to some predetermined pattern. The control can be in response to temperature information communicated to the system from RF temperature sensors at various locations on the wafer. The system can read RFID information from each of the sensors along with associated temperature data from each of the respective sensors, using sensor identifying information to correlate the temperature data with the respective locations on the wafer to map the temperature profile across the wafer. The data can be used in a real-time, closed-loop feedback system to control wafer temperature during processing. Typically, temperature uniformity is desired, and the wafer temperature is preferably controlled at various locations, preferably selectively using a multizone temperature controlled wafer chuck.

The RF temperature sensors on the wafer are preferably provided with the capability of storing energy from a fixed system in the apparatus. RFID technology often provides an RFID circuit that receives an interrogating signal from an RFID reading system and stores sufficient energy from the system to power the RFID transmitting circuit. The temperature sensing portion of an RF temperature sensing device can also be powered in this way, and the entire RF temperature sensing device can be powered from the RF signal that interrogates the device. However, an alternative RF signal that differs from the RFID and data transmitting signal can be used to transmit power to the RF temperature sensing device, or transducers that collect energy from a plasma or other energy source within the processing chamber or elsewhere can be employed.

An RFID system can include antennae or other coupling elements, that can be located at convenient locations in the wafer processing apparatus, for example, in the substrate support. These devices can be specifically located at different portions of a substrate support to communicate with RF sensing devices located only in close proximity, which can eliminate the need for sensor ID data.

The present invention applies RFID technology and wireless sensing technology to the field of semiconductor wafer process monitoring and control. Examples of this technology are, for example, set forth in a number of U.S. patents, including U.S. Pat. Nos. 6,847,912 and 7,148,803, hereby expressly incorporated herein by reference.

An exemplary embodiment of the application of RF sensing technology to semiconductor wafer manufacture is demonstrated in FIG. 1, which diagrammatically shows a semiconductor wafer processing system 10 according to certain aspects of the present invention. The semiconductor wafer system 10 includes, for example, a deposition apparatus 11 having a substrate support 14 situated in a vacuum processing chamber 12 on which is supported a semiconductor wafer 15 for processing. The wafer 15 has a plurality of RFID temperature sensing devices 20 formed on its surface. The RFID sensing devices 20 are active, functional devices that transmit device identification and wafer temperature information in response to an RF interrogation signal. The devices 20 are each powered by energy from the interrogating RF signal that is stored in a capacitor or other storage element on the device 20.

The RF interrogation signal is generated by an RFID communications system 19, which is associated with a controller 17 of the deposition apparatus 11. The controller 17 is programmed to control processes performed in the chamber 12 by the apparatus 11 on the wafer 15. In particular, the controller 17 is programmed to control a wafer temperature maintaining system that maintains a desired temperature and temperature distribution across the wafer 15 during processing in the chamber 12. Such a temperature maintaining system can include heating and cooling elements in the wafer support 14, a backside gas control system that affects heat conduction between the support 14 and the wafer 15, or other process parameters, such as plasma parameters, that influence the temperature of the wafer 15. A monitoring system 18 may also be included for recording or displaying wafer temperature data transmitted from the devices 10.

Figure 1A:
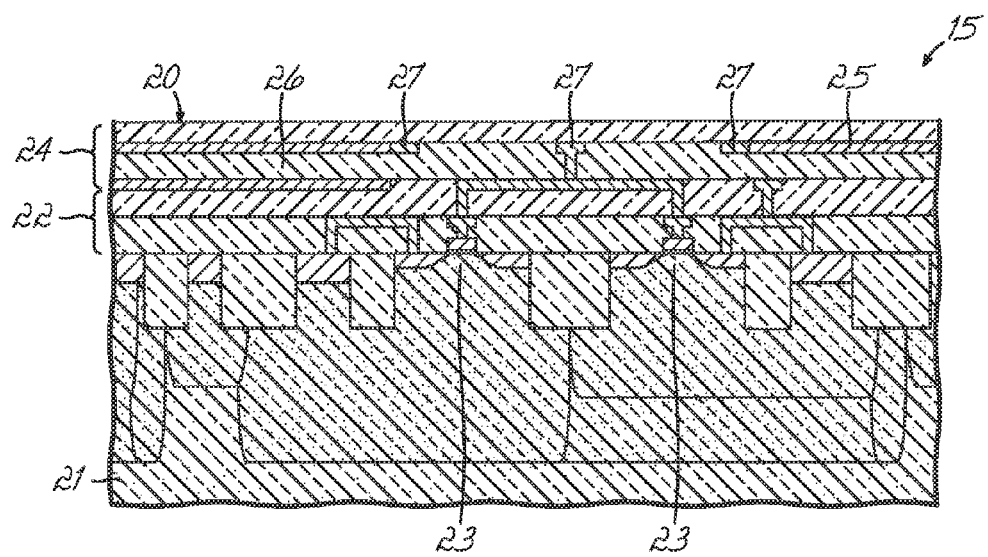
FIG. 1A is an enlarged cross-sectional view of a portion of an RFID temperature sensing semiconductor wafer of FIG. 1.

FIG. 1A is an enlarged fragmentary cross section through the wafer 15 in FIG. 1, and through a device 20 thereon showing parts thereof in symbolic form. The wafer 20 includes the silicon body 21 of the wafer 15 plus certain dielectric and other layers 22 of which are formed transistors and other front-end-of-line devices (FEOL) 23. Overlying these are additional layers 24 that form the interconnects and other components necessary to complete the functional RFID sensing devices 20. These components can include, for example, an RF antenna 25, an energy storage element 26, and conductors that assemble the devices 23 into the circuits of the RFID devices 20. The devices 20 on the wafer 15 have been formed by a series of processes, such as the one being performed in the chamber 12. However, the process being performed in the chamber 12 and illustrated in FIG. 1 is a process being performed subsequent to the formation of the devices 20, and in which process the devices 20 are being operated to sense wafer temperature and to communicate wafer temperature data to the RFID system 19 for use by the controller 17 in the monitoring and control of the process.

Figure 2:
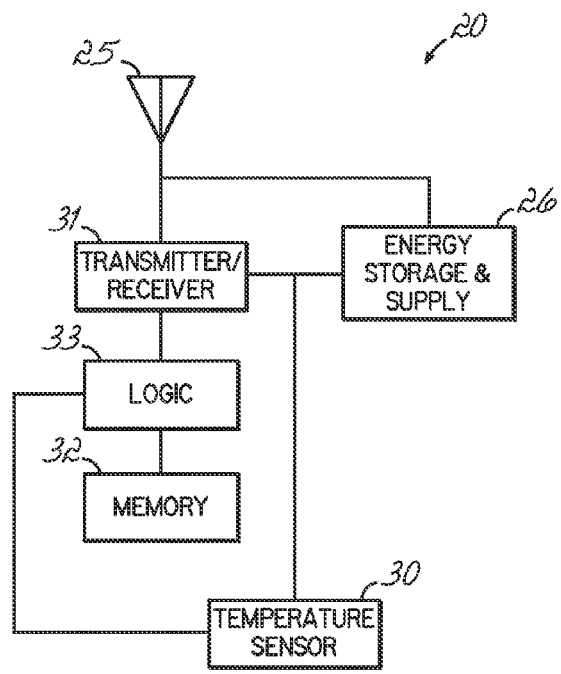
FIG. 2 is a block diagram of an RF sensor on the wafer of FIGS. 1 and 1A.

A block diagram of a representative sensor 20 is illustrated in FIG. 2. Each sensor 20 may include an antenna 25, energy source 26 and a number of circuits made up of various ones of the transistors and other FEOL devices 23 and interconnects 27. These circuits can include, for example, a temperature sensor 30 that is capable of producing digital data of the temperature of the point on the wafer 15 at which the sensor 30 is located, a transmitter-receiver circuit 31 that is coupled to the antenna 25, a memory 32 that can store temperature data and identification data that can identify the particular sensor 20, and a logic circuit 33 to communicate and process information among, and control the operation of, the temperature sensor 30, the transmitter-receiver 31 and the memory 32. The energy source 26 is connected to the antenna 25 and is configured to store energy received by the antenna 25, and to the temperature sensor 30, transmitter-receiver 31, memory 32 and logic 33, to deliver the stored energy thereto to support their operation.

Figure 3A:
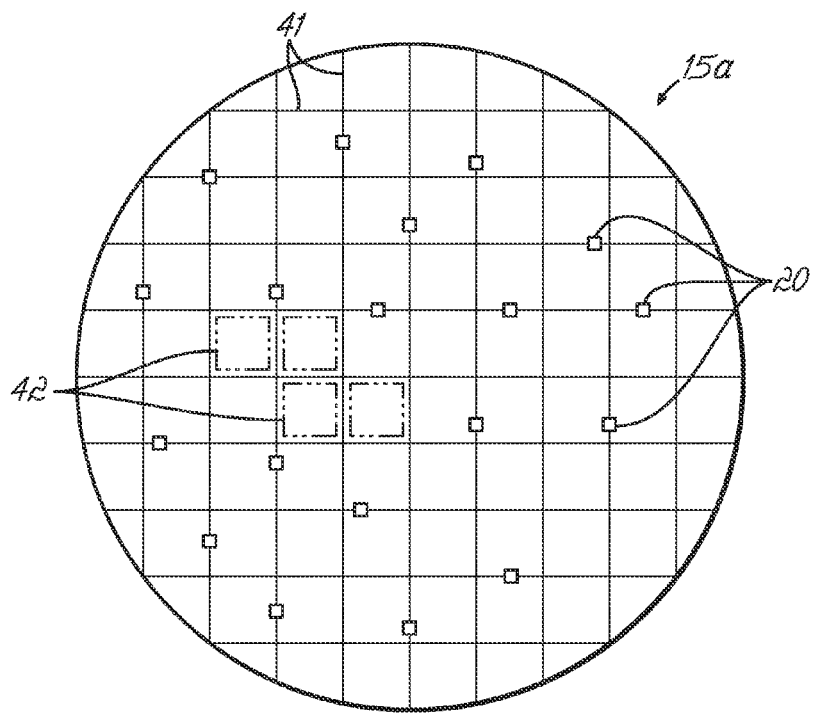
FIG. 3A is a top view of one embodiment of the wafer of FIGS. 1 and 1A.

FIG. 3A illustrates one embodiment 15a of a product semiconductor wafer 15 having a plurality of fully operational and active devices 20 formed thereon. These devices 20 are shown as located in scribe lines 41 of the wafer 20 as integrated semiconductor circuit chips 42, for example processors, are being manufactured on the wafer 15. During the manufacture of the chips 42, the devices 20 will be activated by signals from the RFID system 19 to sense the temperature of the wafer 15 during processing for use by the controller 17. These devices will remain with the product semiconductor wafers 15 through subsequent processes performed in a series of machines, each of which may be equipped with an RFID communication system 19 that monitors or controls the temperature of the wafer 15 during those subsequent processes. In this embodiment, when the manufacture of the chips 42 is complete, the chips 42 will be cut from the wafer 15 by cuts along the scribe lines 41, and the devices 20 will be destroyed.

Figure 3B:
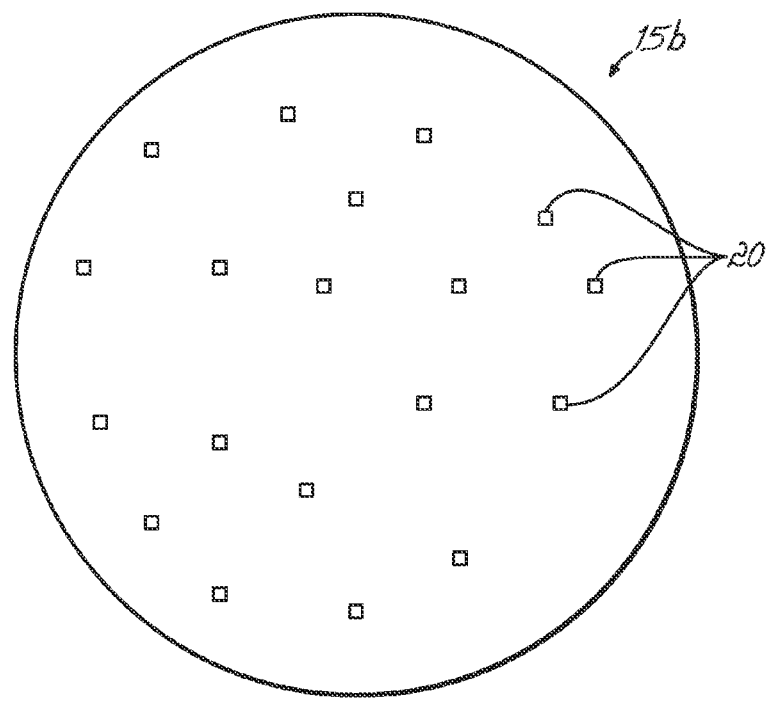
FIG. 3B is a top view, similar to FIG. 3A, of another embodiment of the wafer of FIGS. 1 and 1A.

FIG. 3B illustrates another embodiment 15b of a wafer 15 in which a plurality of devices has been formed in initial processes performed on wafer 15 and the remainder of the wafer 15 has been cleaned to its original state for processing. Wafers 15b can be pre-processed to form the devices 20 thereon by a wafer manufacturer or supplier, and the otherwise clean unprocessed wafers 15b carrying the devices 20 can be provided to chip manufacturers as temperature sensing wafers 15b. Such wafers may be product wafers, but are also suitable to use as test wafers.

Figure 3C:
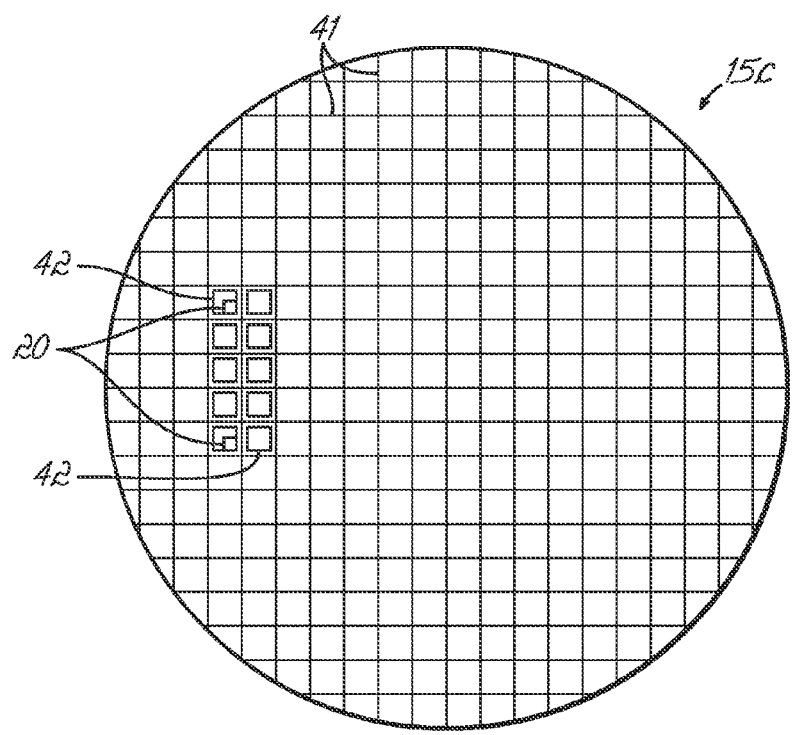
FIG. 3C is a top view, similar to FIGS. 3A and 3B, of a further embodiment of the wafer of FIGS. 1 and 1A.

FIG. 3C illustrates still another embodiment 15c of wafer 15 in which the temperature sensing RFID devices 20 are formed as one of the product chips on the wafer that are cut from the wafer and marketed along with the other chips on the wafer 15. In this embodiment, the devices are located in the dies of the various chips 42 being formed on the wafer 15c. This is a particularly practical embodiment when the devices 20 are high precision devices having more than nominal value. In such embodiments, the devices 20 can be made, for example, along with other chips of similar size and complexity.

The devices 20 can be made according to a variety of circuit designs for RFID and other RF sensing devices. They can also be made of a number of materials and manufactured according to any of a number of recipes that are most compatible with the processes in which they are to be used. In this way, minimal, if any, alteration of the processes or process combinations need be made to incorporate the RFID temperature sensing devices 20 into the recipes and schedules for the manufacture of different semiconductors.

Figure 4:
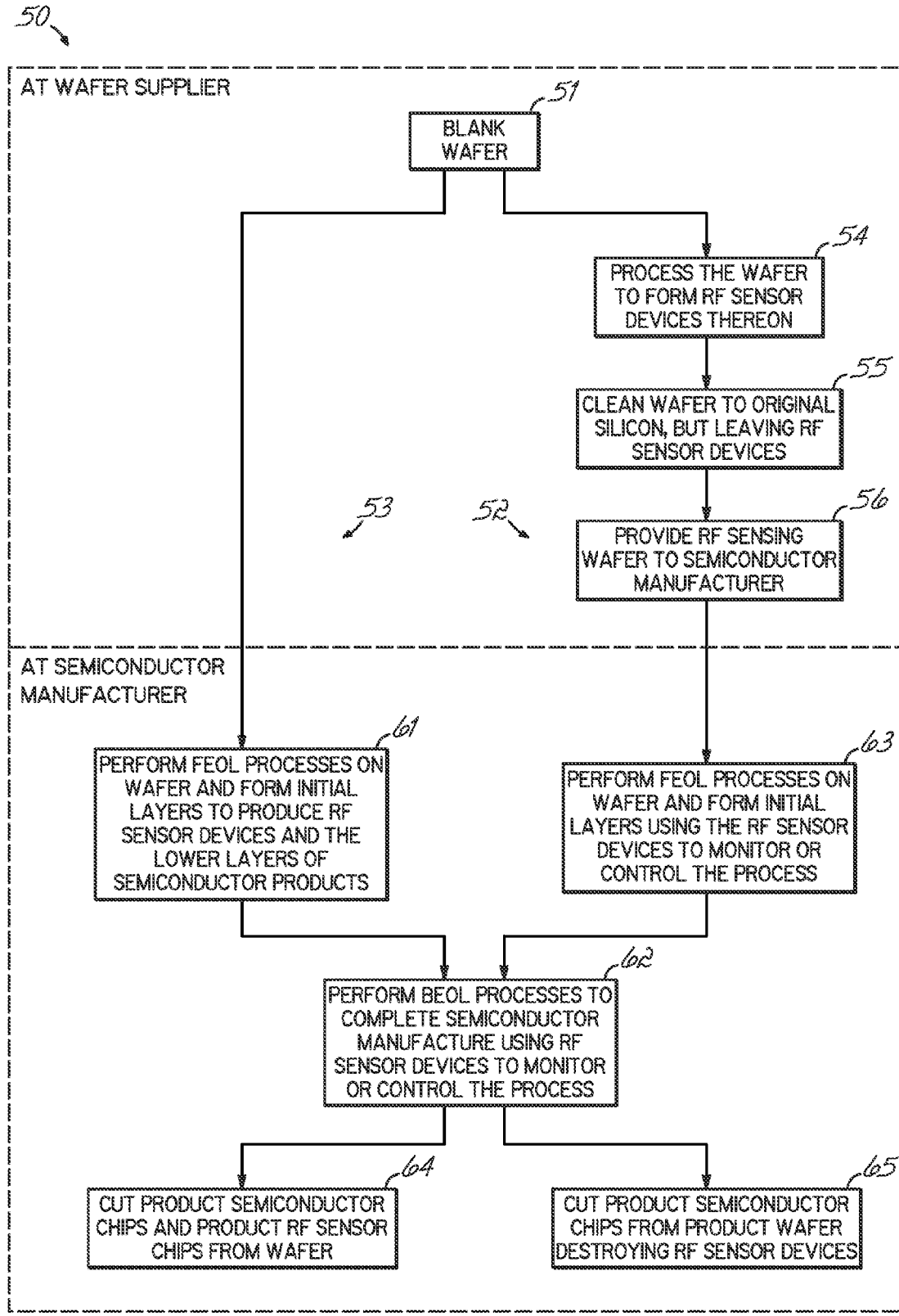
FIG. 4 is a flowchart of certain methods according to principles of the present invention.

The flow of semiconductor manufacturing by making and using the RF sensing devices according to the present invention is represented by the process diagram (50) of FIG. 4. Starting with a blank silicon wafer (51), RF sensing devices 20 (52) can be applied to the devices either before supplying the wafers 15 to a customer for use in semiconductor manufacture, or (52) can be applied by the semiconductor manufacturer after the wafers 15 are supplied. When (54) the wafer supplier forms devices on the wafers 15, (55) the wafer is cleaned of everything other than the devices 20, and (56) the wafer is provided to the semiconductor manufacturer with the operational devices 20 in place on the wafers 15. Otherwise, (53) blank wafers are provided to the semiconductor manufacturer.

When (53) wafers 15 are provided to semiconductor manufacturers in blank, (61) FEOL processes are performed on the wafers 15 to build up the transistors and other fundamental devices that will form both the components of the products that are to be ultimately formed on the wafer and the components of the RF sensing devices. These processes include all those needed to bring the RF sensing devices to the point of being fully operational devices. From that point forward, (62) the devices 20 can be activated and the remainder of the processes can be performed to complete the manufacture of product semiconductor chips on the wafer 15. The embodiment (53) is practical to use where the semiconductor products being formed on the wafer 15 use the same technology in the FEOL processes as do the processes that form the RF sensing devices.

When (52) wafers 15 are provided with the RF sensing devices 20 already formed on the wafers 15, such as are the wafers 15b of FIG. 3B, (63) FEOL processes are first performed on the wafer by the semiconductor manufacturer with RF sensing devices 20 available for use during these processes. Then (62) the back end of line (BEOL) processes are performed on the wafer 15 as in the embodiment (53) above. The embodiment (52) is practical to use where the semiconductor products being formed on the wafer 15 do not necessarily use the same technology in the FEOL processes as do the processes that form the RF sensing devices.

With either of the embodiments (52) or (53), the RF sensing devices (64) can be formed to be disposed of, as for example with the wafer 15a of FIG. 3A, or (65) can be made to be marketable chip products themselves, as with the wafer 15c in FIG. 3C.

Exemplary embodiments of this invention have been described above, but those skilled in the art will readily appreciate that many modifications are possible without materially departing from the invention. Such modifications are within the scope of this invention.

Accordingly, the following is claimed:

1. A method of manufacturing semiconductor wafers comprising:
   processing a semiconductor wafer to form at least one temperature-sensing RF device on the wafer;
   further processing the wafer to form a plurality of semiconductor products on the wafer; and
   during the further processing of the wafer, sensing temperature at locations on the wafer corresponding to each of the at least one RF device and wirelessly transmitting data, including temperature data, from the at least one RF device.

2. The method of claim 1 wherein:
the processing of a semiconductor wafer includes forming a plurality of temperature-sensing RFID devices, each RFID device capable of transmitting a unique device-identifying code and temperature data.

3. The method of claim 2 further comprising:
interrogating the plurality of temperature-sensing RFID devices on the wafer with an RFID communications system; and
receiving a transmitted device-identifying code and transmitted temperature data from the plurality of temperature-sensing RFID devices.

4. The method of claim 3 further comprising:
interpreting a received device-identifying code from the RFID device to correlate the received temperature data with a location on the wafer.

5. The method of claim 4 further comprising:
interpreting received temperature data from the plurality of temperature-sensing RFID devices and controlling the temperature of the wafer at different locations thereon in response to the received data.

6. The method of claim 1 further comprising:
interrogating the RF device on the wafer with an RF communications system; and
receiving transmitted temperature data from the RF device.

7. The method of claim 6 further comprising:
interpreting received data from the RF devices and monitoring a process thereby.

8. The method of claim 6 further comprising:
interpreting received data from the RF devices and controlling a process thereby.

9. The method of claim 6 further comprising:
interpreting received data from the RF devices and controlling the temperature of the wafer at the location in response to the received data.

10. A semiconductor wafer made according to the method of claim 1 having at least one active RFID temperature-sensing device formed thereon.

11. The wafer of claim 10 wherein the wafer is a product wafer and further comprises:
semiconductor device products formed thereon.

12. The wafer of claim 11 wherein:
the semiconductor device products and the active RFID devices include components formed of same layers on the wafer.

13. The wafer of claim 11 wherein:
the RFID devices are marketable high quality RFID temperature sensing temperature-sensing chips.

14. The wafer of claim 11 wherein:
the RFID devices are located on portions of the wafer that are disposable when the semiconductor device products are cut from the wafers.

15. The wafer of claim 10 wherein the RFID temperature sensing temperature-sensing device comprises:
an antenna for receiving an RFID interrogating signal and transmitting RF data;
a temperature sensor for generating wafer temperature data;
one or more memory devices containing ID data identifying the device and for storing wafer temperature information from the temperature sensor;
logic circuitry for storing wafer temperature information in the one or more memory devices in response to wafer temperature data generated by the temperature sensor;
an RFID circuit for transmitting the ID data and data of the wafer temperature information in response to an RFID interrogating signal received by the antenna; and
a power circuit for providing electrical energy for powering the RFID temperature-sensing device from ambient energy.

16. The wafer of claim 15 wherein:
the power circuit is operative to power the RFID temperature-sensing device from energy from a received RFID interrogating signal.

17. The wafer of claim 15 wherein:
the power circuit is operative to power the RFID temperature-sensing device from energy within the chamber other than that from a received RFID interrogating signal.

18. A semiconductor wafer processing apparatus having a processor programmed to operate the apparatus to manufacture semiconductor wafers according to the method of claim 1, the apparatus further comprising:
a processing chamber;
a wafer support in the processing chamber; and
an RF system having an RF antenna coupled to the chamber, transmitter and receiver circuits connected to the antenna and an RF generator connected to the transmitter and receiver circuits, and being configured to communicate with an RF temperature-sensor device on a wafer that is supported on the wafer support during the processing of a wafer.

19. The apparatus of claim 18 wherein:
the processor is connected to the receiver circuit and programmed to interpret a signal received by the antenna from the RF temperature sensor to derive wafer temperature information therefrom.

20. The apparatus of claim 19 wherein:
the processor is programmed to interpret the signal received by the antenna from the RF temperature sensor to derive the identity of the temperature sensor therefrom and to correlate the wafer temperature information with the identity of the sensor.

21. The apparatus of claim 19 further comprising:
a controller operative to monitor the processing of the wafer in response to the wafer temperature information.

22. The apparatus of claim 19 further comprising:
a controller operative to control the temperature of the wafer in response to the wafer temperature information.

23. The apparatus of claim 19 further comprising:
a controller operative to control the processing of the wafer in response to the wafer temperature information.

* * * * *

UNITED STATES PATENT AND TRADEMARK OFFICE
CERTIFICATE OF CORRECTION

PATENT NO. : 7,629,184 B2 Page 1 of 1
APPLICATION NO. : 11/688421
DATED : December 8, 2009
INVENTOR(S) : John M. Kulp It is certified that error appears in the above-identified patent and that said Letters Patent is hereby corrected as shown below:

In Claim 15, Column 7, lines 56-57, "temperature sensing temperature-sensing" should read --temperature-sensing--.

Signed and Sealed this

Eleventh Day of May, 2010

David J. Kappos
*Director of the United States Patent and Trademark Office*